United States Patent
Ohmi

[11] Patent Number: 6,003,243
[45] Date of Patent: Dec. 21, 1999

[54] WAFER CLEANING APPARATUS AND METHOD THEREOF

[76] Inventor: Tadahiro Ohmi, 1-17-301, Komegabukuro 2-Chome, Aoba-ku, Sendai-shi, Miyagi-ken 980, Japan

[21] Appl. No.: 08/596,245
[22] PCT Filed: Aug. 9, 1994
[86] PCT No.: PCT/JP94/01314
  § 371 Date: Mar. 26, 1996
  § 102(e) Date: Mar. 26, 1996
[87] PCT Pub. No.: WO95/05004
  PCT Pub. Date: Feb. 16, 1995

[30] Foreign Application Priority Data

Aug. 9, 1993 [JP] Japan ................................... 5-197442

[51] Int. Cl.⁶ ............................................... F26B 19/00
[52] U.S. Cl. ................................ 34/218; 34/92; 34/418
[58] Field of Search ................... 34/92, 58, 418; 134/153, 148, 902

[56] References Cited

FOREIGN PATENT DOCUMENTS

| 9294004 | 7/1994 | European Pat. Off. . |
| 4-287922 | 10/1992 | Japan . |
| 5-144804 | 6/1993 | Japan . |

*Primary Examiner*—Henry Bennett
*Assistant Examiner*—Malik N. Drake
*Attorney, Agent, or Firm*—Marshall, O'Toole, Gerstein, Murray & Borun

[57] ABSTRACT

An apparatus and method for cleaning and drying a wafer in a single cleaning tank using a cleaning solution including means for producing a hydrogen activation seed from hydrogen-containing gas and means for introducing active gas containing the hydrogen activation seed into the cleaning tank wherein dangling bonds on the wafer are terminated with hydrogen by spraying the active gas containing the hydrogen activation seed on the wafer.

7 Claims, 1 Drawing Sheet

WAFER CLEANING APPARATUS AND METHOD THEREOF

TECHNICAL FIELD

The present invention relates to a wafer cleaning apparatus and a method thereof, and more specifically relates to a wafer cleaning apparatus and a method thereof wherein a wafer surface after cleaned is terminated with hydrogen.

BACKGROUND ART

In a semiconductor manufacturing process, cleaning of a wafer is a very important process to remove any impurity such as metal, organic matter, and fine particles that badly affect semiconductor characteristics. However, a wafer surface after cleaned and dried has many dangling bonds thereon which cause the surface to become very active. This produces a difficulty, for example, that the surface is again contaminated and a natural oxide film is nonuniformly formed thereon as the surface makes contact with air upon the wafer being carried. The present inventor has investigated a method of terminating dangling bonds on the wafer surface with hydrogen for stabilization of the wafer surface as a method of preventing the foregoing difficulty.

Such a hydrogen terminating method includes: 1) a method of subjecting a wafer to a dilute fluoric acid processing after a final cleaning process of the wafer for a ultra-pure water processing, 2) a method of processing a wafer with boiled ultra-pure water after final cleaning of the wafer, and 3) a method of processing a wafer in the atmosphere of hydrogen at a temperature of 600° C. or more.

However, these methods are unlikely to completely terminate a wafer surface with hydrogen and are insufficient to prevent recontamination after cleaning.

Further, for drying a wafer, there are used a nitrogen blow and a rotary dryer or the like, however, they are unlikely to completely remove water molecules from the wafer surface and hence a nonuniform natural oxide film is produced.

In view of the drawbacks with the prior art, it is an object of the present invention to provide a wafer cleaning apparatus and a method thereof capable of preventing contamination of a wafer surface after cleaned and production of a natural oxide film on the wafer surface by completely terminating the wafer surface with hydrogen after cleaned.

DISCLOSURE OF THE INVENTION

A wafer cleaning apparatus according to the present invention for achieving cleaning and drying of a wafer in a single cleaning tank with a cleaning solution, in its first gist, includes a hydrogen activation seed production means for producing a hydrogen activation seed from gas involving hydrogen and active gas introduction means for introducing active gas involving the hydrogen activation seed into the cleaning tank characterized in that the activation gas involving the hydrogen activation seed is sprayed on the wafer to terminate dangling bonds on the wafer with hydrogen.

Said gas involving hydrogen is preferably mixed gas of hydrogen and inert gas, the inert gas being preferably argon gas.

It is further preferable to construct at least part of a contact part of said hydrogen activation seed production means between said hydrogen activation seed production means and said gas involving hydrogen with a material such as Ni serving as a catalyst for a hydrogen radical formation reaction, and it is preferable to heat the material serving as the catalyst to 300 to 450° C.

It is further preferable to construct at least part of a contact part of said active gas introduction means between said active gas introduction means and said active gas with a material serving as a catalyst for a hydrogen radical formation reaction.

A wafer cleaning method in the second gist of the present invention of cleaning wafer with a cleaning solution and thereafter drying the wafer comprises the steps of spraying gas involving a hydrogen activation seed on a wafer surface during the drying, and terminating dangling bonds on the wafer surface with hydrogen.

FUNCTION

Hereinbelow, function of the present invention will be described together with embodiment examples.

A wafer surface is terminated with hydrogen at low temperature more simply and completely by spraying argon gas involving a hydrogen activation seed to the wafer surface in the course of a wafer drying process after the wafer is cleaned with a cleaning solution such as various pharmaceutical solutions and ultra-pure water. A hydrogen activation seed is very active and is conventionally believed to be short in its life. In accordance with the present invention, however, in which a hydrogen activation seed is introduced into a cleaning tank, and high purity argon gas and hydrogen gas are applied together with formation of active gas introduction means with a material having a catalytic action, the hydrogen activation seed is substantially prolonged in its life and a high concentration hydrogen activation seed is introduced onto a wafer surface for ensurance of complete termination of the wafer surface with hydrogen as described above.

A cleaning tank according to the present invention includes an installation member for a wafer therein together with a nozzle for introducing various pharmaceutical solutions and a solution discharge outlet. For such a cleaning tank there are usable one where various pharmaceutical solutions and ultra-pure water are introduced thereinto into which a wafer is dipped for cleaning or one where a wafer is mounted on a rotary chuck and a pharmaceutical solution and ultra-pure water are sprayed upon the wafer that is simultaneously rotated for cleaning and the like. After cleaning with the pharmaceutical solution and ultra-pure water, gas containing a hydrogen activation seed is finally sprayed on the wafer which is in turn dried, to effectually terminate dangling bonds produced owing to the cleaning with hydrogen. It is a matter of course that a member constituting the present cleaning tank is constructed with a material resistant to various pharmaceutical solutions used for cleaning.

As a means of generating the hydrogen activation seed, it may be employed a material that the part or the entire surface of an inner surface of a piping is constructed with a material serving as a catalyst for a hydrogen radical formation reaction. Provided mixture gas of inert gas and hydrogen gas is directed to flow through such a piping, the hydrogen gas in the mixture gas can be converted to an activation seed such as a radical. For increasing the efficiency of the activation it is preferable to heat the catalyst (piping). Heating temperature preferably ranges from 300 to 450° C., and more preferably from 300 to 400° C. The reason is that at lower than 300° C. a less amount of the hydrogen activation seed is produced, but at 450° C. or higher, although the amount of the hydrogen activation seed is more produced, there is the possibility of any impurity being released from the inner surface of the piping and being mixed into the mixed gas unless any passivated film is formed on the inner surface of the piping.

In the present invention, for a catalyst used for production of the hydrogen activation seed there is preferable a material containing Ni, for example a Ni-based alloy. There are preferable among the Ni-based alloy Ni—Mo alloys and Ni—W alloys. More concretely, there is preferable Hastelloy (trade mark).

As an example of the foregoing piping, there is usable stainless steel where the surface thereof is electropolyshed to a surface roughness of 1 µm or less. In this case, the stainless steel has its surface on which there is formed a Passivation film formed by a heat treatment of the surface of the stainless steel in an oxidizing atmosphere with impurity concentration of 10 ppb or less. There is further preferable a passivation film formed with a reducing processing in an hydrogen atmosphere after the formation of the passivation film. The surface of such a passivation film can prevent any impurity from mixing into the mixture gas because of its taking a chrome oxide as a chief ingredient. The passivation film takes a chrome oxide as a chief ingredient which contains a nickel oxide. It is considered that nickel in the nickel oxide serves as a catalyst which activates hydrogen gas in contact with the surface of the passivation film to produce a hydrogen activation seed.

It is a matter of course that means for producing the hydrogen activation seed in the present invention may include other than that of the piping construction described above those where fibrous, reticulate, spongy, tubular catalysts are provided in a container. Such a construction is advantageous to increase a contact area with the hydrogen gas and improve the activation efficiency.

Impurities in the inert gas and in the hydrogen gas for use in the present invention are preferably 10 ppb or less, and more preferably 1 ppb or less. Further, a mixing ratio of the hydrogen gas in the mixture gas is preferably 0.1% or more, and more preferably 1 to 10% or more. Within this region the amount of production of the hydrogen activation seed is further improved. As the inert gas there are preferably used He gas, $N_2$ gas, Ar gas, etc., and particularly preferably Ar.

The active gas introduction means of the present invention is to introduce the active gas containing the hydrogen activation seed produced by the hydrogen activation seed production means for which a piping is commonly used for example. In order to prevent the concentration of the produced hydrogen activation seed from being lowered it is preferable to construct the inner surface of the active gas introduction means with a material containing Ni, etc., for example. The active gas is preferably introduced from the upper portion of the cleaning tank and is uniformly supplied onto the upper surface of a wafer by directing it to flow downward.

Figure 1:
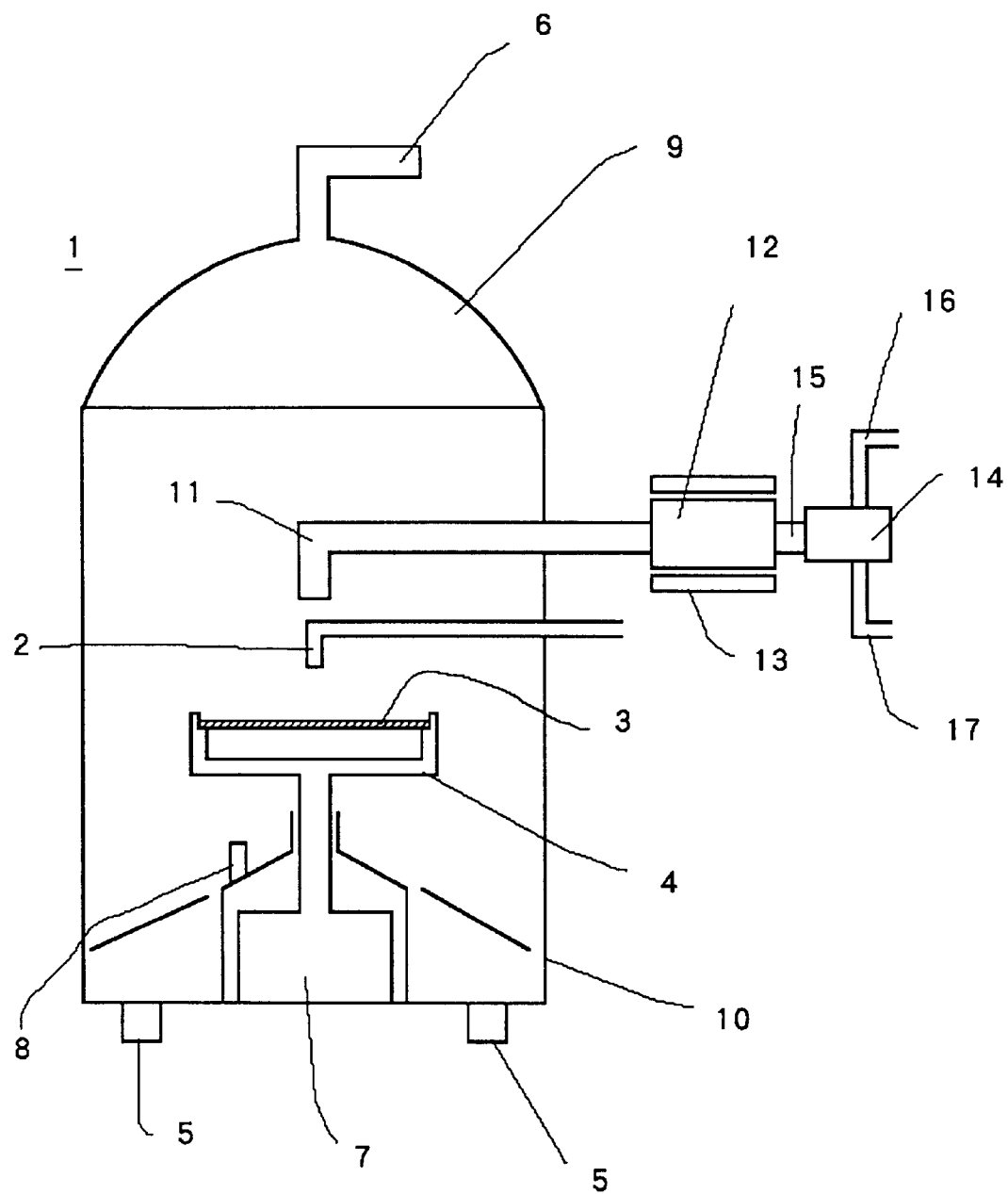
FIG. 1 is a view illustrating an example of a wafer cleaning apparatus according to the present invention. (Description of Numerals)

1 cleaning tank, 2 pharmaceutical solution nozzle, 3 Si wafer, 4 wafer chuck, 5 exhaust gas/effluent outlet, 6 $N_2$ gas introduction inlet, 7 rotary motor, 8 back surface cleaning nozzle, 9 sealing hood, 10 body, 11 mixture gas introduction pipe, 12 means to produce hydrogen activation seed, 13 heating means, 14 mixer of Ar gas and H2 gas, 15 mixture gas piping, 16 Ar gas piping, 17 $H_2$ gas piping

BEST MODE FOR CARRYING OUT THE INVENTION

Hereinbelow, a Embodiment of the present invention will be described in detail.

FIG. 1 illustrates a wafer cleaning apparatus for use in the present embodiment. As illustrated in FIG. 1, numeral 1 is a cleaning tank which is divided into a body 10 and a closing hood 9. Numeral 2 is a plurality of pharmaceutical solution nozzles connected with various pharmaceutical solution suppliers (not shown), 3 is a Si wafer, 4 is a wafer chuck, 5 is an exhaust/discharge outlet, 6 is a N2 gas introduction inlet, 7 is a rotary motor, 8 is a nozzle for cleaning the back surface of a wafer moving therealong, 11 is a active gas introduction pipe for spraying a hydrogen active seed on a wafer, 12 is a hydrogen active seed production means including heating means 13 provided thereon, 14 is a mixer for mixing Ar gas and H2 gas, 15 is a mixture gas piping, and 16 and 17 are an Ar gas piping and a H2 gas piping, respectively, which are connected with an Ar gas supplier and a H2 gas supplier (both not shown), respectively.

In the present embodiment, for the hydrogen activation seed production means there is used one where a 10 µm diameter Ni wire is rounded and bound into a bundle, and inserted into a cylindrical stainless (SUS316) container, the inner surface of which is electropolished, the container being heated to 350° C. with the heater 13. For the active gas introduction pipe there is used a stainless pipe (SUS316), the inner surface of which is electropolished. A mixing ratio of the mixture gas is Ar 90% and H2 10%.

Next, there will be described a cleaning method using the foregoing wafer cleaning apparatus.

$N_2$ gas is introduced from the N2 introduction inlet 6, the wafer 3 is set to the chuck 4, and the closing hood is closed. The wafer is rotated at 1500 rpm, and simultaneously through individual nozzles of the pharmaceutical solution nozzle 2 there are dropped in succession on the wafer surface ultra-pure water, ozone containing ultra-pure water (organic matter removal/oxide film formation), hydrofluoric acid+hydrogen peroxide (natural oxide film/metal removal), ammonium hydroxide+hydrogen peroxide(fine particl·organic matter·metal removal), hydrofluoric acid+ hydrogen peroxide(natural oxide film·metal removal), and ultra-pure water for cleaning of the wafer. Successively, the mixture gas containing the hydrogen activation seed is sprayed on the wafer from the mixture gas introduction pipe and simultaneously the wafer is rotated at 1500 rpm and is dried.

Si—H bonds of the wafer surface cleaned as described above are measured with FT-IR spectroscopy. After the wafer is left behind in a clean room for 6 hours, the amount of production of the natural oxide film is measured. Further, after the wafer is dipped in a 1 ppm Cu aqueous solution in order to indicate the difficulty of any metal impurity adhering to the wafer surface, the coverage of metal on the wafer surface is measured with TRXRF.

As a comparison example, the same measurements will be described also for the case of Ar gas being used as the drying gas.

In the comparison example a result of an FT-IR measurement substantially does not exhibit a band in the vicinity of 2100 cm-1, while in the foregoing embodiment a band is clearly demonstrated. More particularly, it is found that there are many Si—H bonds on the wafer surface and the surface is terminated with hydrogen in the present embodiment. Production of the natural oxide film is never observed in the present embodiment(1 to 1.5 nm in the comparison example).

In contrast, although the coverage of metal on the wafer surface in the comparison example is 1.0×1015, that in the present embodiment is a detection limit(5×1010).

As described above, dangling bonds produced owing to cleaning are effectively terminated to stabilize a wafer surface by spraying gas containing hydrogen activation seed on the wafer surface so that the present invention manifests very excellent effect on preventing any impurity and a natural oxide film from adhering to the wafer surface and being produced.

INDUSTRIAL APPLICABILITY

According to the method of the present invention, dangling bonds produced on a wafer surface owing to wafer cleaning are completely terminated to stabilize the wafer surface and hence prevent the wafer and a natural oxide film from being recontaminated upon its being carried and from being produced.

According to the present invention, it is possible to provide a wafer cleaning apparatus suitable for manufacturing a high performance semiconductor device with a simplified construction.

I claim:

1. An apparatus for cleaning and drying a wafer, the apparatus comprising:

a cleaning tank:

means for supplying a cleaning solution to said wafer within said cleaning tank;

means for producing hydrogen activation seed from hydrogen-containing gas;

means for introducing active gas containing said hydrogen activation seed into said cleaning tank; and, means for spraying said active gas containing said hydrogen activation seed on the wafer in said cleaning tank to terminate dangling bonds on the wafer with hydrogen.

2. A wafer cleaning apparatus according to claim 1 wherein said hydrogen-containing gas is a mixture of hydrogen and inert gas.

3. A wafer cleaning apparatus according to claim 2 wherein said inert gas is argon gas.

4. A wafer cleaning apparatus according to claim 1 wherein at least part of said means for producing hydrogen activation seed that contacts said hydrogen-containing gas is constructed from a material serving as a catalyst for forming hydrogen radicals.

5. A wafer cleaning apparatus according to claim 4 wherein said material serving as a catalyst contains Ni.

6. A wafer cleaning apparatus according to claim 4 wherein said material serving as a catalyst is heated to 300 to 450° C.

7. A wafer cleaning apparatus according to claim 1 wherein at least part of said means for introducing active gas that contacts said active gas is constructed from a material serving as a catalyst for forming hydrogen radicals.

* * * * *